(12) United States Patent
Oshikiri

(10) Patent No.: US 7,861,057 B2
(45) Date of Patent: Dec. 28, 2010

(54) STORAGE DEVICE AND DATA OUTPUT CIRCUIT

(75) Inventor: Takashi Oshikiri, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 619 days.

(21) Appl. No.: 11/852,596

(22) Filed: Sep. 10, 2007

(65) Prior Publication Data

US 2008/0071967 A1 Mar. 20, 2008

(30) Foreign Application Priority Data

Sep. 14, 2006 (JP) ............................... 2006-248904

(51) Int. Cl.
*G06F 12/00* (2006.01)
(52) U.S. Cl. ..................... 711/173; 711/103; 711/165; 713/100; 714/6; 714/7; 714/8
(58) Field of Classification Search ................. 711/103, 711/165, 173; 713/100; 714/6, 7, 8
See application file for complete search history.

(56) References Cited

U.S. PATENT DOCUMENTS 5,608,910 A * 3/1997 Shimakura .................. 718/100
6,360,293 B1 * 3/2002 Unno .......................... 711/103
2003/0233512 A1 * 12/2003 Lee ............................. 711/103

FOREIGN PATENT DOCUMENTS

| JP | 9-231800 | 9/1997 |
| JP | 2006-18453 | 1/2006 |

* cited by examiner

*Primary Examiner*—Stephen C Elmore
(74) *Attorney, Agent, or Firm*—Oblon, Spivak, McClelland, Maier & Neustadt, L.L.P.

(57) ABSTRACT

A memory is provided which simplifies the manufacturing process on the supplier side while satisfying specifications provided from the user side. An address space of a memory core includes an information storage region, a code region, and a no-write region. The information storage region includes a first region where no-write region information is written and a second region where a fixed value is written. Program code is written in the code region. The no-write region information indicates the position of the no-write region, and the fixed value indicates a fixed value that is intended to be written to the no-write region. The ROM selects between the fixed value and original read data that is obtained by a data selecting section directly from the memory core, and outputs the selected one as read data.

14 Claims, 11 Drawing Sheets

F I G . 1 4
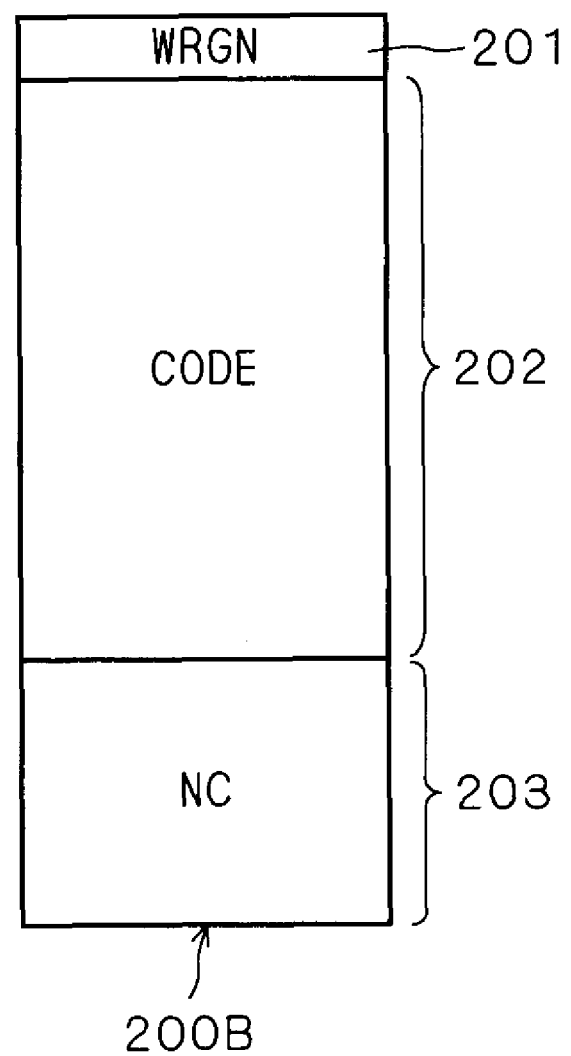

STORAGE DEVICE AND DATA OUTPUT CIRCUIT

BACKGROUND OF THE INVENTION

1. Field of the Invention

The present invention relates to a technique of reading data from a memory.

2. Description of the Background Art

For the supply of a ROM (Read Only Memory) in which program code is written, the specifications may specify not only the program code itself but also the data stored in the entire ROM. One of the purposes thereof is to previously avoid problems that would be caused when data is read from a memory area not intended for access by the user of the ROM.

FIG. 12 is a diagram conceptually showing an example of a specification 100 of a ROM in which program code is written. Such a specification 100 often specifies not only the program code CODE but also no-write region information WRGN and a fixed value FXVL. The no-write region information WRGN indicates a region where the program code CODE should not be stored (hereinafter referred to also as a no-write region). The fixed value FXVL is fixed value data to be written to the no-write region, such as 00H, FFH, etc.

FIG. 13 is a conceptual diagram illustrating an address space 200A. Data is written to the address space 200A faithfully according to the specification 100. Specifically, the no-write region information WRGN is written in an information storage region 201, the program code CODE is written in a code region 202, and a plurality of the fixed values FXVL are written in the no-write region 203.

Conventional techniques related to the present invention are disclosed in Japanese Patent Application Laid-Open Nos. 2006-18453 and 9-231800 (1997).

For the supplier of the ROM using a write-type nonvolatile memory, the writing of the fixed value FXVL is a troublesome job because it lengthens the manufacturing time. At the time of shipment, such a ROM using write-type nonvolatile memory, unlike a common mask ROM, requires a longer time to write the program code as the program code is larger-sized. It is also a troublesome job to check the fixed value FXVL in the no-write region 203 in the test conducted prior to the shipment.

FIG. 14 is a conceptual diagram illustrating an address space 200B. The address space 200B stores the no-write region information WRGN and the program code CODE in the code region 202, but no active write operation is applied to the no-write region 203. As a result, unknown values NC exist as values in the no-write region 203.

On the other hand, the user requires a ROM having an address space faithfully based on the specification 100, and the ROM will often be tested on the user side, e.g. by adopting checksum, on the precondition that the fixed value FXVL is stored in the no-write region 203.

SUMMARY OF THE INVENTION

An object of the present invention is to provide a technique for supplying a memory that simplifies the manufacturing process on the supplier side while satisfying specifications provided from the user side.

According to a first aspect of the storage device of the present invention, a storage device includes: (a) a memory core having a first region and a second region both assigned to a given address space, and a third region that stores a fixed value and region information that indicates a position of the second region; and (b) a data selecting section, wherein (i) the data selecting section is supplied with the region information, a physical address in the address space, the fixed value, and original read data that is data stored in the memory core at the physical address, (ii) the data selecting section outputs the original read data as read data when the physical address specifies a location other than the second region, and (iii) the data selecting section outputs the fixed value as the read data when the physical address specifies the second region.

Preferably, the third region is assigned to the address space, and more preferably, the third region is provided in the second region.

Alternatively, preferably, the third region is not assigned to the address space of the memory core.

Alternatively, preferably, the second region includes a plurality of second regions, and the third region stores a table that associates pieces of region information that respectively indicate positions of the second regions and fixed values that are to be outputted from the data selecting section when the respective second regions are specified.

According to the first aspect of the storage device of the present invention, the fixed value is outputted for a read operation to the second region from the outside of the storage device, irrespective of values stored in the second region. This makes it possible to simplify the manufacturing process on the supplier side, while satisfying required specifications provided from the user side.

According to a second aspect of the storage device of the present invention, in its first aspect, the storage device further includes a register that stores the fixed value and the region information. The data selecting section is supplied with the fixed value and the region information from the register.

According to the second aspect of the storage device of the present invention, it is not necessary to supply the fixed value and the region information from the third region every time the physical address is updated, which avoids considerable delay of access.

According to a third aspect of the storage device of the present invention, in its first aspect, the storage device further includes an address conversion table that converts a logical address provided from outside to the physical address. The memory core stores, in the second region: a redundancy region that stores data in place of a fault area in the first region; and a redundancy conversion region that stores in association a fault address indicating the fault area and a redundancy address indicating the redundancy region. When the physical address corresponds to the fault address, the address conversion table adopts the redundancy address as the physical address, and when the redundancy address is adopted as the physical address, the data selecting section outputs the original read data as the read data even though the redundancy address as the physical address specifies the second region.

According to the third aspect of the storage device of the present invention, the storage device has a redundancy function utilizing the second region, and it outputs the fixed value for a read operation to the second region from the outside of the storage device.

According to a fourth aspect of the storage device of the present invention, in its third aspect, the storage device further includes a register that stores the fixed value, the region information, and the redundancy address. The data selecting section is supplied with the fixed value, the region information, and the redundancy address from the register.

According to the fourth aspect of the storage device of the present invention, it is not necessary to supply the fixed value, the region information and the redundancy address from the memory core every time the physical address is updated, which avoids considerable delay of access.

According to a first aspect of the data output circuit of the present invention, a data output circuit includes: an address comparator that is supplied with region information that indicates a position of a region assigned to an address space of a memory core and a physical address in the address space, the address comparator outputting a control signal indicating whether the physical address specifies the region indicated by the region information; and a selector that is supplied with a fixed value and original read data that is data stored in the memory core at the physical address, the selector outputting one of the fixed value and the original read data on the basis of the control signal.

According to the first aspect of the data output circuit of the present invention, the fixed value is outputted when the physical address for reading from the memory core specifies the region indicated by the region information. This makes it possible to simplify the manufacturing process on the supplier side, while satisfying specifications provided from the user side.

According to a second aspect of the data output circuit of the present invention, in its first aspect, the data output circuit further includes a register that stores the fixed value and the region information.

According to the second aspect of the data output circuit of the present invention, it is not necessary to supply the fixed value and the region information from the memory core every time the physical address is updated, which avoids considerable delay of access.

According to a third aspect of the data output circuit of the present invention, in its first aspect, the data output circuit further includes an address conversion table that converts a logical address provided from outside to the physical address. When the physical address corresponds to a fault address that indicates a fault area in the memory core, the address conversion table adopts, as the physical address, a redundancy address that indicates a redundancy region that stores data in place of the fault area. When the redundancy address is adopted as the physical address, the selector outputs the original read data even though the redundancy address as the physical address specifies the region indicated by the region information.

According to the third aspect of the data output circuit of the present invention, the data output circuit has a redundancy function utilizing the region from which the fixed value is intended to be outputted, and it outputs the fixed value for a read operation to this region from the outside of the memory core.

According to a fourth aspect of the data output circuit of the present invention, in its third aspect, the data output circuit further includes a register that stores the fixed value, the region information, and the redundancy address. The address comparator is supplied with the region information and the redundancy address from the register, and the selector is supplied with the fixed value from the register.

According to the fourth aspect of the data output circuit of the present invention, it is not necessary to supply the fixed value, the region information and the redundancy address from the memory core every time the physical address is updated, which avoids considerable delay of access.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a conceptual diagram illustrating an address space.

DESCRIPTION OF THE PREFERRED EMBODIMENTS

First Preferred Embodiment

Figure 1:
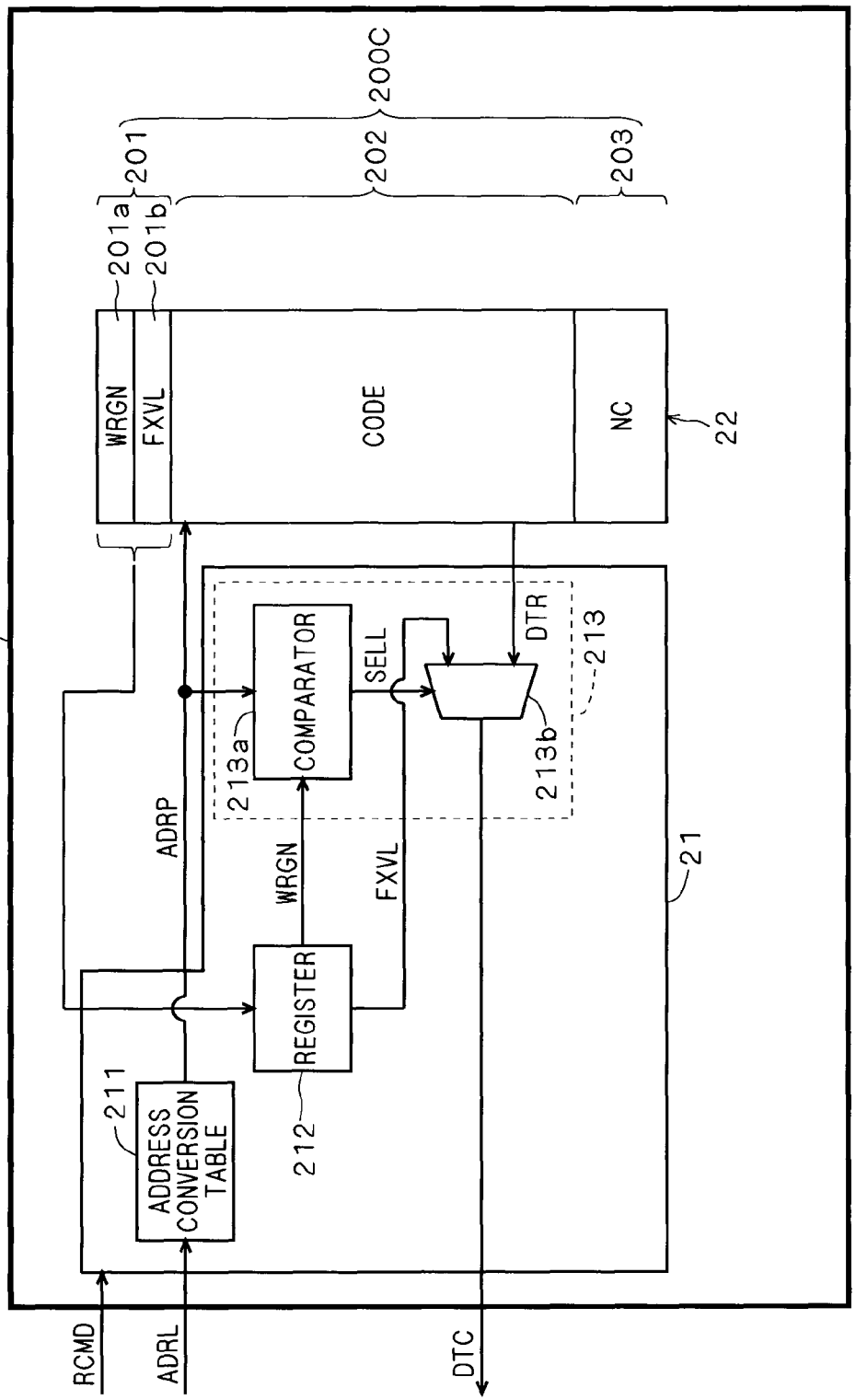
FIG. 1 is a block diagram illustrating the configuration of a ROM according to a first preferred embodiment of the present invention.

FIG. 1 is a block diagram illustrating the configuration of a ROM 2 as a storage device according to a first preferred embodiment of the present invention. The ROM 2 includes a controller 21 and a memory core 22.

The memory core 22 is indicated with an address space 200C. The address space 200C includes an information storage region 201, a code region 202, and a no-write region 203. The information storage region 201 includes a first region 201a in which no-write region information WRGN is written, and a second region 201b in which a fixed value FXVL is written. Program code CODE is written in the code region 202. It is not necessary to apply an active write operation to the no-write region 203, and unknown values NC exist there.

The no-write region information WRGN indicates the position of the no-write region 203, or specifically physical addresses in the address space 200C, and the fixed value FXVL indicates a fixed value that is intended to be written to the no-write region 203.

The controller 21 is a data output circuit that accesses the memory core 22 according to a read command RCMD and a logical address ADRL provided from the outside of the ROM 2, and outputs read data DTC that is selected in a manner described below.

The controller 21 includes an address conversion table 211 for converting the logical address ADRL to a physical address ADRP in the memory core 22.

The controller 21 includes a register 212 for storing the no-write region information WRGN and the fixed value FXVL.

The controller 21 includes a data selecting section 213 for making a selection between the fixed value FXVL and original read data DTR directly obtained from the memory core 22 and outputting the selected one as the read data DTC.

The data selecting section 213 includes an address comparator 213a and a selector 213b. The address comparator 213a is supplied with the no-write region information WRGN from the register 212 and the physical address ADRP from the address conversion table 211. The selector 213b is supplied with the original read data DTR and the fixed value FXVL, and outputs one of them on the basis of a control signal SEL provided from the address comparator 213a.

Figure 2:
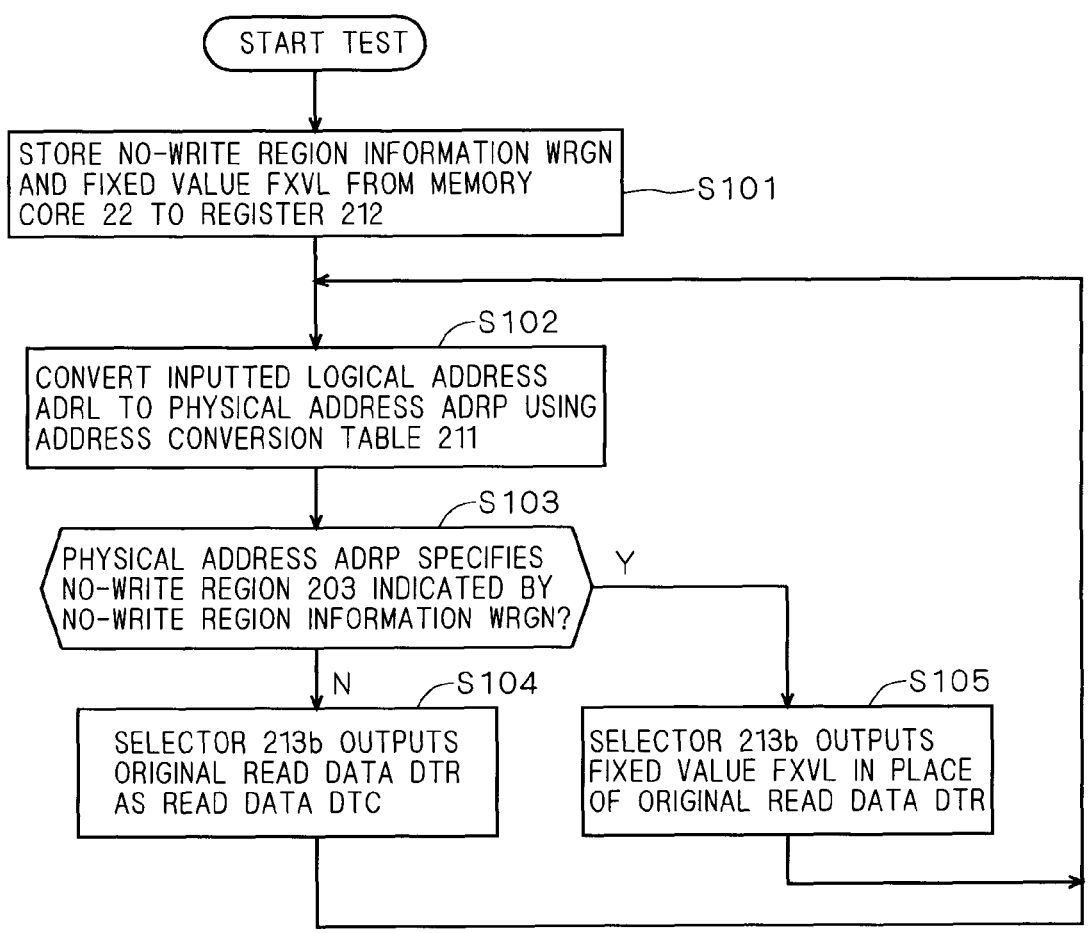
FIG. 2 is a flowchart illustrating an operation of the ROM of the first preferred embodiment of the present invention.

FIG. 2 is a flowchart illustrating the operation performed by the controller 21 when externally testing the ROM 2 shown in FIG. 1. In Step S101, the no-write region information WRGN and the fixed value FXVL are stored into the register 212 from the memory core 22. Next, in Step S102, a logical address ADRL, supplied from outside of the ROM 2, is converted to a physical address ADRP in the address conversion table 211.

Next, in Step S103, it is checked whether the physical address ADRP specifies the inside of the no-write region 203 that is indicated by the no-write region information WRGN. When the decision is negative, program code CODE, or no-write region information WRGN, fixed value FXVL, is read.

Thus, in Step S104, the control signal SEL from the address comparator 213a causes the selector 213b to output the original read data DTR as the read data DTC.

On the other hand, when the decision of Step S103 is affirmative, it means that the external command intends to read data from the no-write region 203.

It is externally expected that the fixed value FXVL is stored in the no-write region 203, but actually, as mentioned above, the unknown values NC are stored in the no-write region 203. Accordingly, in Step S105, the control signal SEL causes the selector 213b to output the fixed value FXVL as the read data DTC.

In this way, even when the fixed value FXVL is not actively written to the no-write region 203 of the memory core 22, it is possible to output the fixed value FXVL when a command for reading from the no-write region 203 is provided from the outside of the ROM 2. This makes it possible to simplify the manufacturing process on the supplier side, while satisfying the specifications provided from the user side.

Also, the no-write region information WRGN and the fixed value FXVL are stored in the register 212, and it is therefore not necessary to supply the no-write region information WRGN and the fixed value FXVL from the information storage region 201 to the address comparator 213a for each access to the physical address ADRP, which avoids considerable delay of access. Accordingly, when the physical address ADRP is updated after Step S104 or Step S105, the process returns not to Step S101 but to Step S102.

Needless to say, the flowchart of FIG. 2 can be adopted not only when testing the ROM 2 but also when actually using the ROM 2 to read the program code.

Second Preferred Embodiment

The technique described in the first preferred embodiment can be applied to provide a so-called redundancy region in the no-write region 203. This is because the ROM 2 can be regarded as storing the fixed value FXVL in the no-write region 203, irrespective of the values actually stored in the no-write region 203.

Figure 3:
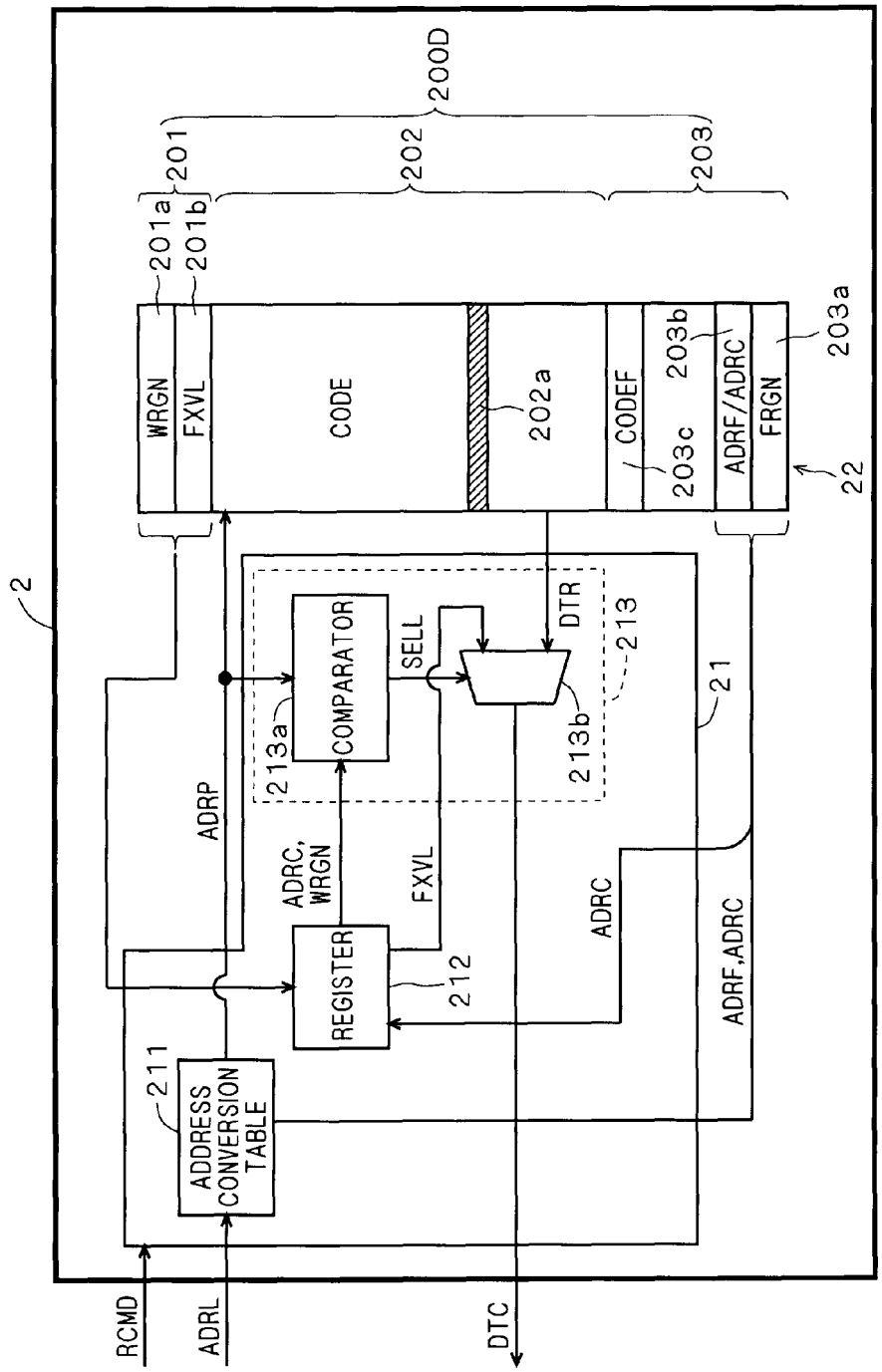
FIG. 3 is a block diagram illustrating the configuration of a ROM according to a second preferred embodiment of the present invention.

FIG. 3 is a block diagram illustrating the configuration of a ROM 2 as a storage device according to a second preferred embodiment of the present invention. The configuration adopts the block shown in the first preferred embodiment, but signals are differently sent and received in some ways.

For a first difference, the address space 200C is replaced by an address space 200D. The address space 200D includes a redundancy indication region 203a, a redundancy conversion region 203b, and a redundancy region 203c that are provided in the no-write region 203.

The redundancy indication region 203a stores redundancy indication information FRGN that indicates the position of the redundancy conversion region 203b, or specifically physical addresses in the address space 200D. The redundancy indication region 203a is located in a given position in the no-write region 203, e.g. at the largest physical address in the no-write region 203.

The redundancy conversion region 203b associates and stores fault address(es) ADRF of the code region 202 and redundancy address(es) ADRC specifying the redundancy region 203c.

The redundancy region 203c stores code CODEF that was originally to be stored at the fault address(es) ADRF. FIG. 3 illustrates a fault area 202a that corresponds to fault address (es) ADRF.

For a second difference, the register 212 stores not only the no-write region information WRGN and the fixed value FXVL but also the redundancy address(es) ADRC. Also, the address comparator 213a is supplied not only with the no-write region information WRGN but also with the redundancy address(es) ADRC.

For a third difference, the address conversion table is supplied with the fault address(es) ADRF and the redundancy address(es) ADRC.

Figure 4:
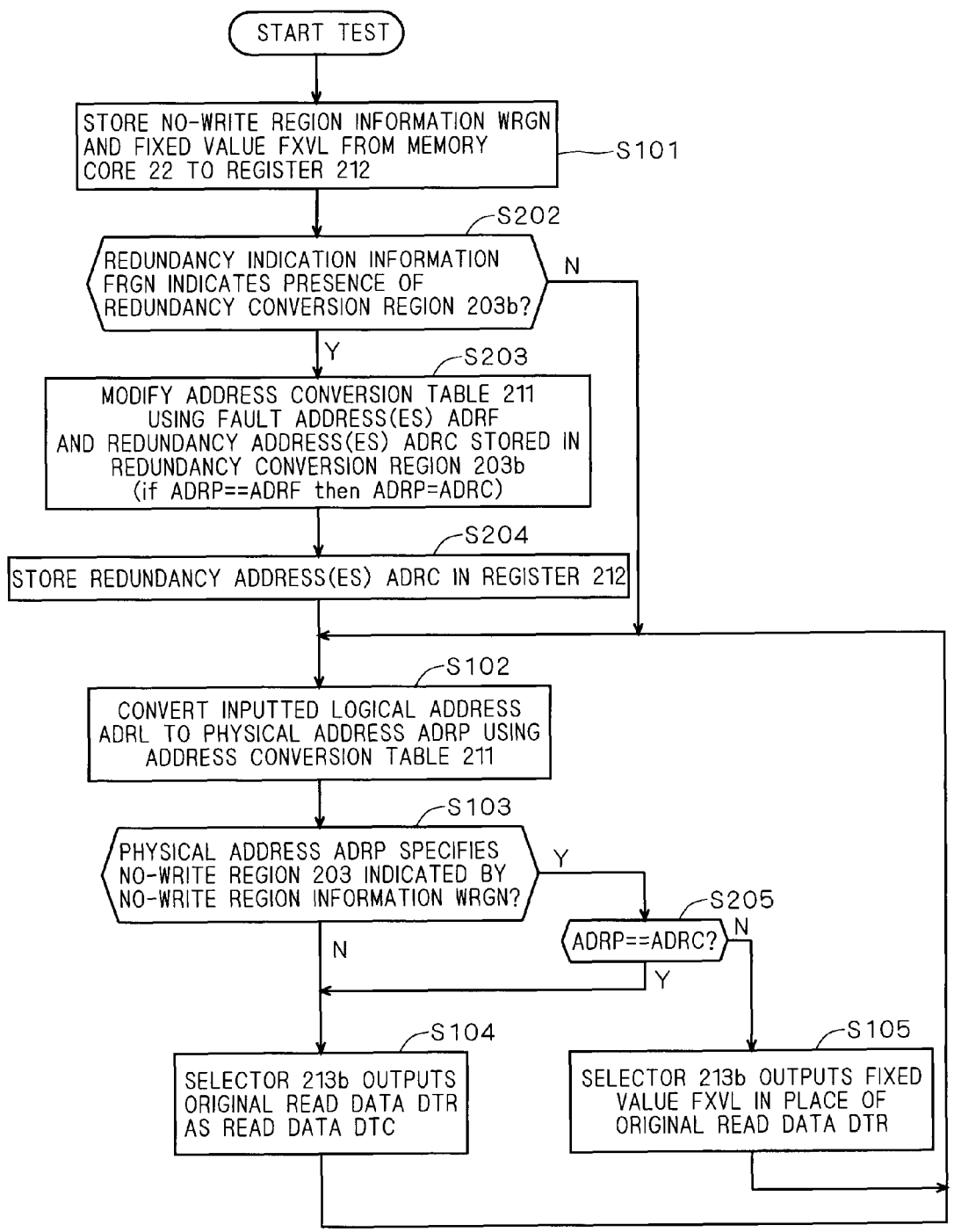
FIG. 4 is a flowchart illustrating an operation of the ROM of the second preferred embodiment of the present invention.

FIG. 4 is a flowchart illustrating the operation performed by the controller 21 when externally testing the ROM 2 shown in FIG. 3. As compared with the flowchart of FIG. 2, this flowchart additionally includes Steps S202 to S204 between Steps S101 and S102, and Step S205 between Steps S103 and S105.

In Step S202, it is checked whether the redundancy indication information FRGN indicates the presence of the redundancy conversion region 203b. As mentioned above, the redundancy indication information FRGN is stored in a fixed position, and it is therefore not necessary for the controller 21, when making the decision of Step S202, to know the physical address ADRP specifying the redundancy indication region 203a where the redundancy indication information FRGN is stored.

For example, the redundancy indication information FRGN can represent the absence of the redundancy conversion region 203b by indicating a location other than the no-write region 203, and it can represent the presence of the redundancy conversion region 203b by indicating a location in the no-write region 203.

When the decision of Step S202 is negative, the process moves to Step S102, and then the process proceeds as described in the first preferred embodiment. As will be described later, though Step S205 exists, the decision of Step S205 is negative when the decision of Step S202 is negative, and so the process advances as described in the first preferred embodiment.

When the decision of Step S202 is affirmative, the address conversion table 211 is modified in Step S203. Specifically, when a physical address ADRP corresponds to a fault address ADRF, it is not desirable to access the fault area 202a with the intact address, because the redundancy region 203c is adopted in place of the fault area 202a. Accordingly, when the physical address ADRP corresponds to a fault address ADRF, then the redundancy address ADRC indicating the redundancy region 203c is adopted in place of it (in the diagram, this replacement is shown as "if ADRP==ADRF then ADRP=ADRC").

Then, in Step S204, the redundancy address(es) ADRC are stored in the register 212. The order of Steps S203 and S204 may be exchanged.

After Steps S202 to S204 have been performed, Step S102 is performed just like when the decision of Step S202 is negative. It should be noted that, after Steps S202 to S204, the address conversion table 211 has been modified in Step S203.

After Step S102, the memory core 22 is accessed by using the physical address ADRP. The physical address ADRP was obtained using the address conversion table 211 that was modified in Step S203, and so the physical address ADRP never takes a fault address ADRF. Accordingly, when the decision of Step S103 is negative, Step S104 is performed as in the first preferred embodiment. That is, the original read data DTR is adopted as the read data DTC.

On the other hand, when the decision of Step S103 is affirmative, there are two possibilities. That is, the fixed value FXVL, which is intended to be stored in the no-write region 203, may be expected from the outside of the ROM 2, or the code CODEF, which is intended to be stored at the fault address ADRF, may be expected. In the former case, Step S105 should be performed as in the first preferred embodiment, and in the latter case, the code CODEF from the redundancy region 203c should be adopted as the read data DTC.

The redundancy address ADRC has already been adopted as the physical address ADRP, in place of the fault address ADRF. Accordingly, when the code CODEF is read from the redundancy region 203c corresponding to the redundancy address ADRC, the code CODEF is read as the original read data DTR.

Accordingly, Step S205 checks whether the physical address ADRP corresponds to a redundancy address ADRC. When the decision is negative, Step S105 is performed to provide the fixed value FXVL as the read data DTC. When the decision is affirmative, Step S104 is performed to provide the code CODEF as the original read data DTR, and then as the read data DTC.

The coincidence between the physical address ADRP and redundancy address ADRC occurs in the presence of the redundancy conversion region 203b (in other words, in the presence of the fault address ADRF). Accordingly, as mentioned earlier, the decision of Step S205 is negative when the decision of Step S202 is negative.

Needless to say, the flowchart of FIG. 4 can be adopted not only to test the ROM 2 but also to actually use the ROM 2 to read the program code.

When the no-write region 203 is utilized as a redundancy region in this way and there is a fault address ADRF, the process requires an operation of writing the code CODEF at the redundancy address ADRC that replaces the fault address ADRF where the code CODEF is originally to be written. Such a process will be described next.

Figure 5:
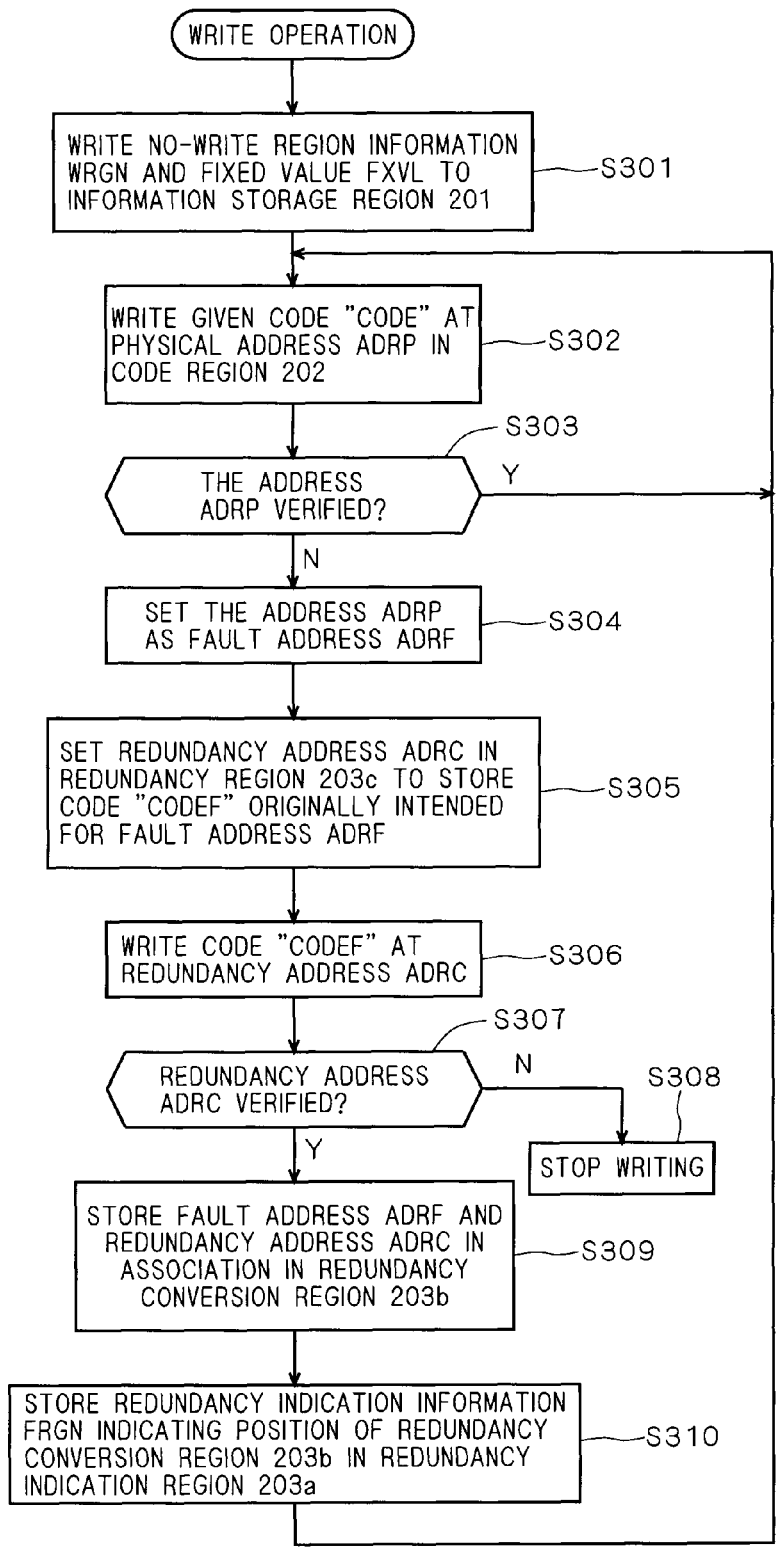
FIG. 5 is a flowchart illustrating a write operation to the ROM of the second preferred embodiment of the present invention.

FIG. 5 is a flowchart illustrating the write operation to the memory core 22. In Step S301, the no-write region information WRGN and the fixed value FXVL are written to the information storage region 201. Preferably, the position of the information storage region 201 is determined by default, e.g. at the smallest physical addresses. Next, in Step S302, given code CODE is written at a physical address ADRP in the code region 202. In Step S303, verification is performed to see whether the physical address ADRP is faulty or not. When the decision is favorable, the process returns to Step S302 to write the next code. Though not specifically shown in FIG. 5, Step S302 is not performed after the code CODE has been written to the entire code region 202.

When the verification in Step S303 decides the physical address ADRP as faulty, it is regarded as a fault address ADRF (Step S304). Then, the code CODE originally to be written at the fault address ADRF is regarded as code CODEF, and a redundancy address ADRC for storing the code is set in the redundancy region 203c (Step S305). For example, the redundancy region 203c is set at the smallest physical address in the no-write region 203. When there are a plurality of fault addresses ADRF and the redundancy region 203c is to be expanded, it is expanded sequentially to larger physical addresses.

Then, in Step S306, the code CODEF is written at the redundancy address ADRC. Also, verification like that of Step S303 is applied to check the redundancy address ADRC. When the decision indicates a fault, the process moves to Step S308 to stop the write operation. Alternatively, the process may return to Step S305 to set a redundancy address ADRC again. In this case, it is desirable to previously set an upper limit value of the re-setting. This is because redundancy addresses ADRC cannot be re-set unlimitedly, since the no-write region 203 is used to set not only the redundancy region 203c but also the redundancy indication region 203a and the redundancy conversion region 203b.

When the decision of Step S307 is favorable, the process moves to Step S309 where the fault address ADRF and the redundancy address ADRC are associated with each other and stored in the redundancy conversion region 203b. In the no-write region 203, the redundancy conversion region 203b is located at the second largest physical address, for example. When there are a plurality of fault addresses ADRF and the redundancy conversion region 203b is to be expanded, it is expanded sequentially to smaller physical addresses.

Then, in Step S310, the redundancy indication information FRGN indicating the position of the redundancy conversion region 203b is stored in the redundancy indication region 203a. For example, the redundancy indication region 203a is set at the largest physical address. After Step S310 is done, the process returns to Step S302 to perform Step S302 and the following steps until the code CODE has been written to the entire code region 202, unless the process moves from Step S307 to Step S308.

The write operation described so far provides the address space 200D shown in FIG. 3. The memory core 22 has a redundancy function, but the ROM 2, seen from the outside, is regarded as storing the fixed value FXVL in the no-write region 203.

The address conversion table 211 is modified in Step S203, and the redundancy address(es) ADRC are stored in the register 212 in Step S204. Accordingly, when the physical address ADRP is updated after Step S104 or Step S105, the process can return to Step S102 as in the first preferred embodiment. It is thus not necessary to read the no-write region information WRGN, fixed value FXVL and redundancy address(es) ADRC from the memory core 22 at each access to the physical address ADRP, which avoids considerable delay of access.

Third Preferred Embodiment

Figure 6:
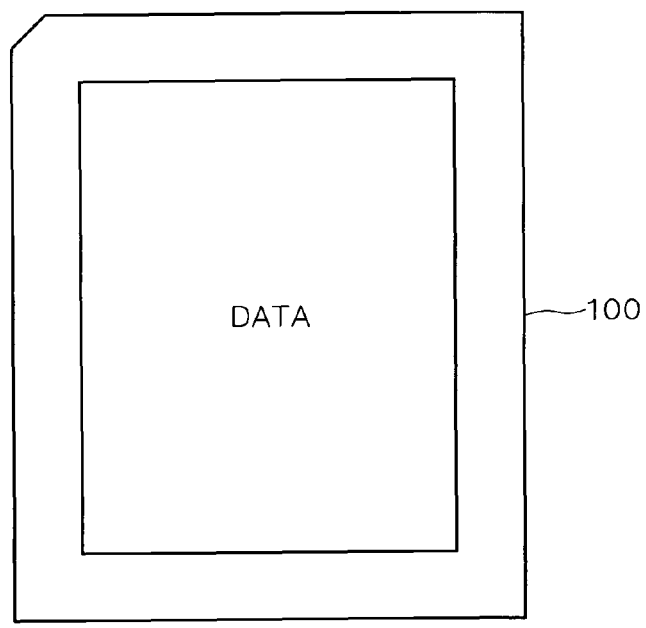
FIG. 6 is a diagram conceptually showing another example of ROM specifications.
Figure 7:
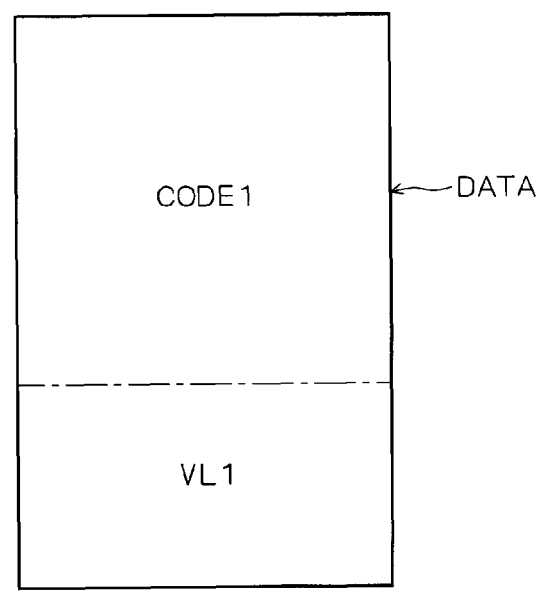
FIG. 7 is a diagram conceptually showing the contents of a data group.
Figure 12:
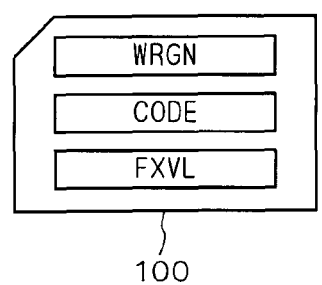
FIG. 12 is a diagram conceptually showing an example of ROM specifications.
Figure 13:
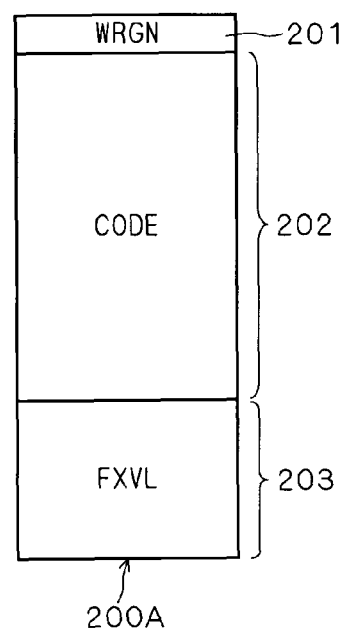
FIG. 13 is a conceptual diagram illustrating an address space.

The specification 100 of a ROM to which program code is written is not always provided in the form as illustrated in FIG. 12. FIG. 6 is a diagram conceptually showing another example of the specification 100. This specification 100 simply specifies logical addresses and a group of data DATA to be stored at the logical addresses. FIG. 7 is a diagram conceptually illustrating the contents of the data group DATA. Program code CODE1 and a fixed value group VL1 are located at different addresses. The fixed value group VL1 is a collection of fixed values FXVL.

When the specification 100 is provided in such a form, the no-write region information WRGN indicating the position of the fixed value group VL1 and the constituent fixed values FXVL are obtained by scanning the entirety of the data group DATA.

Since the specification does not specify addresses for storing the no-write region information WRGN and fixed values FXVL, the no-write region information WRGN and fixed values FXVL cannot be stored in the address space to which the memory core 22 is assigned.

Figure 8:
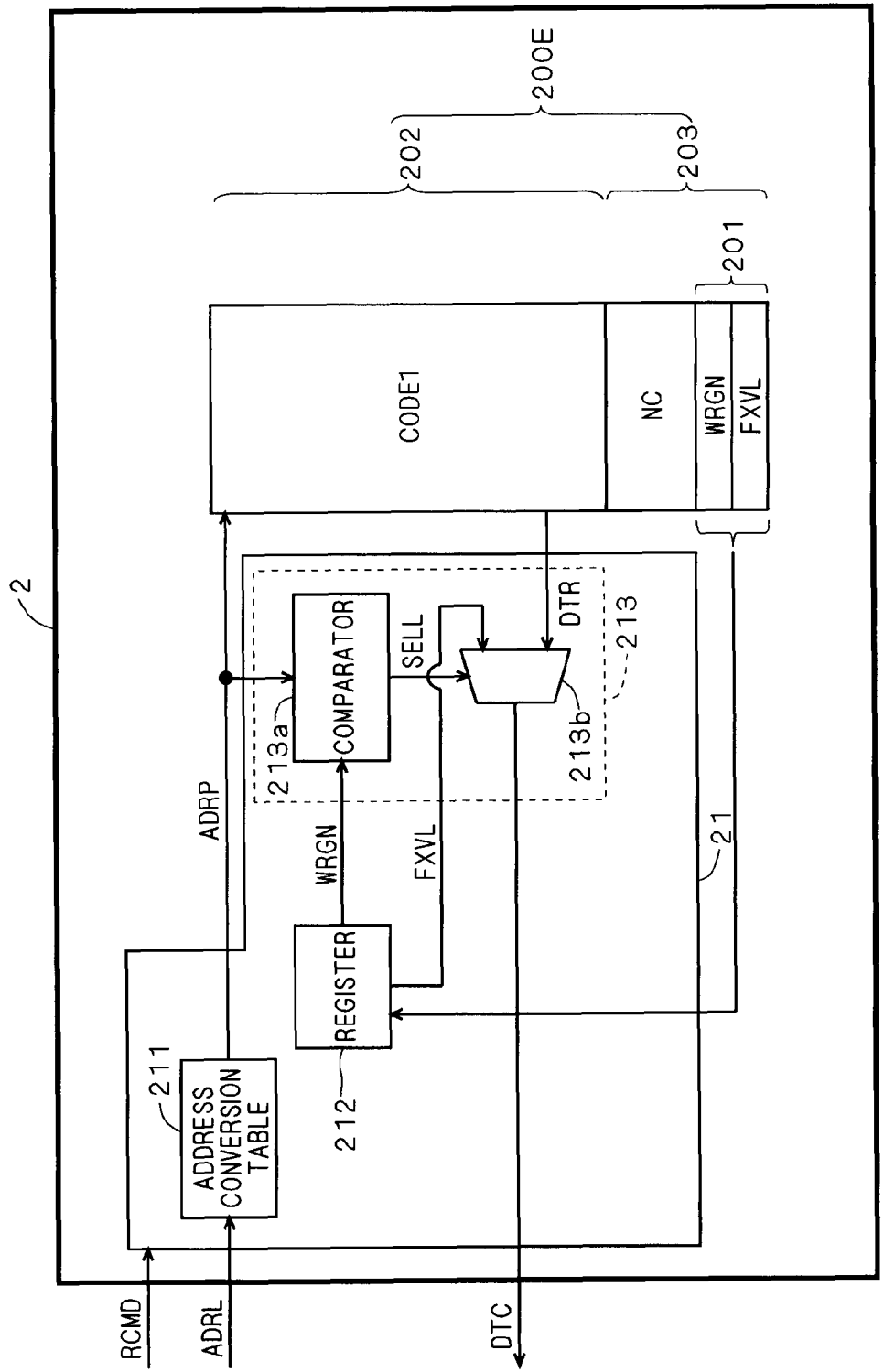
FIG. 8 is a block diagram illustrating the configuration of a ROM according to a third preferred embodiment of the present invention.

Accordingly, in this preferred embodiment, an information storage region 201 is provided in the no-write region 203. FIG. 8 illustrates the memory core 22 with an address space 200E, and the controller 21 is configured as described in the first preferred embodiment.

A code region 202 and the no-write region 203 are assigned to the address space 200E, and the information storage region 201 is not separately assigned to the address space 200E. The information storage region 201 uses addresses of the address space 200E to which the no-write region 203 is assigned. The program code CODE1 is stored in the code region 202. Thus, as in the first preferred embodiment, the fixed value FXVL is read as the read data DTC when the no-write region 203 is accessed from the outside of the ROM 2, and the original read data DTR is read from the program code CODE1 as the read data DTC when the code region 202 is accessed. Thus, the ROM 2 functions as a ROM that stores the data group DATA of FIG. 7 according to the specification 100.

When a redundancy region is provided in the no-write region 203 as described in the second preferred embodiment, the information storage region 201 is located in a position other than the redundancy indication region 203a, the redundancy conversion region 203b, and the redundancy region 203c.

Fourth Preferred Embodiment

Figure 9:
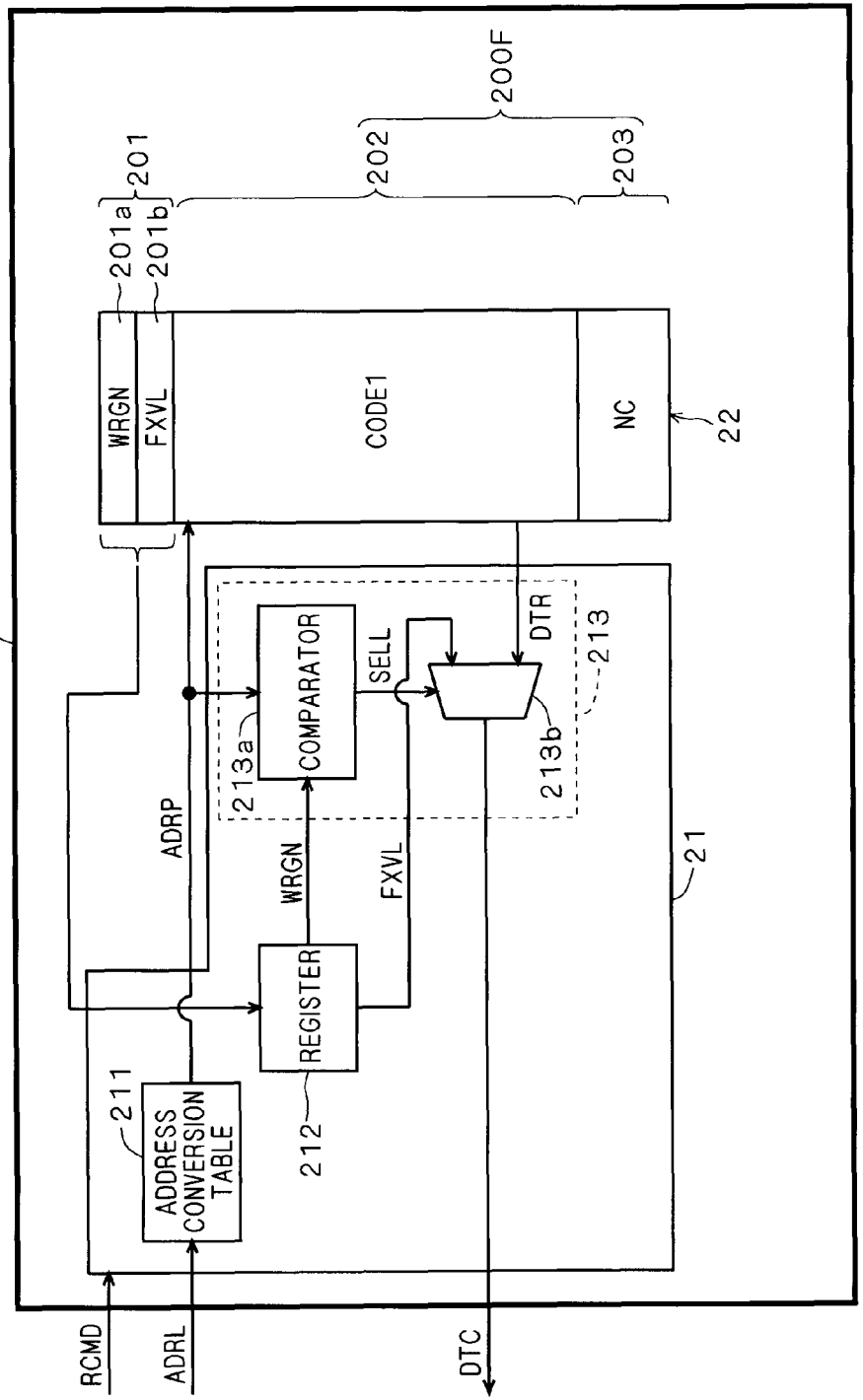
FIG. 9 is a block diagram illustrating the configuration of a ROM according to a fourth preferred embodiment of the present invention.

FIG. 9 is a block diagram illustrating the configuration of a ROM 2 as a storage device according to a fourth preferred embodiment of the present invention. The ROM 2 includes a controller 21 and a memory core 22 in the same way as that of the first preferred embodiment, and the controller 21 is configured in the same way as that of the first preferred embodiment.

In the memory core 22, the code region 202 and the no-write region 203 are assigned to the address space 200F, and the code region 202 stores program code CODE1. The information storage region 201 is not assigned to the address space 200F. However, in Step S101 (FIG. 2), the controller 21 is capable of reading the no-write region information WRGN and fixed values FXVL from the information storage region 201 and storing them in the register 212. Such a region that is not assigned to the address space but is accessible is generally provided in the memory core and referred to as, e.g. a test region.

In this way, like that of the third preferred embodiment, the ROM 2 functions as a ROM that stores the data group DATA shown in FIG. 7 according to the specification 100.

Fifth Preferred Embodiment

Figures 10, 11:
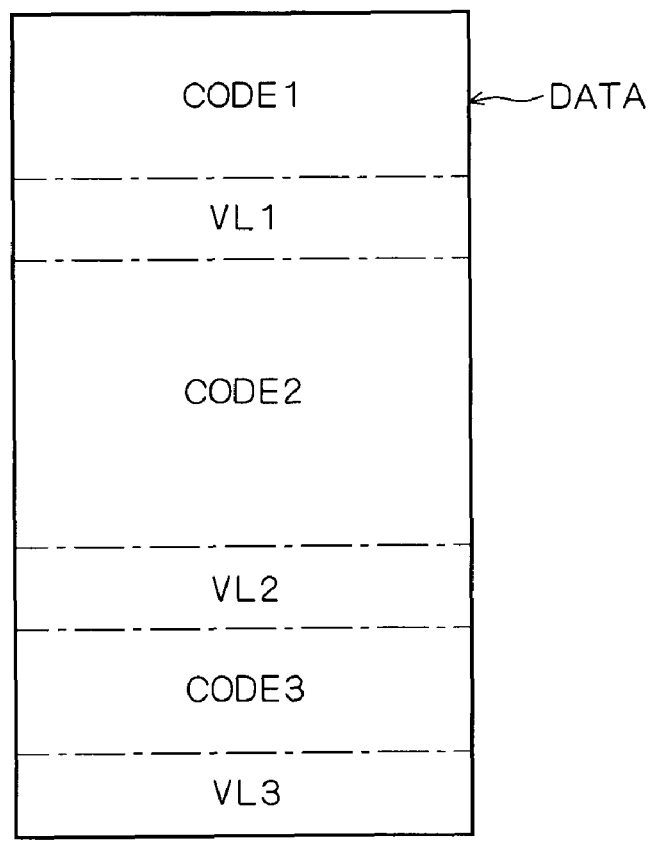
FIG. 10 is a diagram conceptually illustrating the contents of a data group according to a fifth preferred embodiment of the present invention.
FIG. 11 is a diagram illustrating a table according to the fifth preferred embodiment of the present invention.

FIG. 10 is a diagram conceptually showing an example in which, in a data group DATA, there are a plurality of regions where no program code exists. The data group DATA includes program code CODE1, a fixed value group VL1, program code CODE2, a fixed value group VL2, program code CODE3, and a fixed value group VL3 sequentially arranged in this order.

In such a case, the information storage region 201 may store a table that associates no-write region information WRGN1, WRGN2 and WRGN3, respectively indicating the positions of the fixed value groups VL1, VL2 and VL3, and the fixed values FXVL1, FXVL2 and FXVL3 constituting the fixed value groups VL1, VL2 and VL3. FIG. 11 is a diagram conceptually illustrating such a table.

The information storage region 201, storing such a table, may be assigned to the address space 200C or 200D as illustrated in the first and second preferred embodiments, or may be assigned to the no-write region 203 as illustrated in the third preferred embodiment, or may be provided in an accessible memory core region that is not assigned to the address space as illustrated in the fourth preferred embodiment.

Modification

The preferred embodiments illustrated a configuration in which the controller 21 as a data output circuit is included in the ROM 2 as a storage device, but the present invention is not limited to this configuration. For example, the controller 21 may be provided separately from the memory core 22. In this case, too, when the physical address ADRP for reading from the memory core 22 specifies the no-write region 203 indicated by the no-write region information WRGN, the controller 21 outputs the fixed value FXVL as the read data DTC, irrespective of the original read data DTR. This makes it possible to simplify the manufacturing process of the memory core 22 on the supplier side, while satisfying the specifications from the user side.

In this way, the controller 21 illustrated in the preferred embodiments is included in the present invention also as a discrete device.

While the invention has been described in detail, the foregoing description is in all aspects illustrative and not restrictive. It is understood that numerous other modifications and variations can be devised without departing from the scope of the invention.

What is claimed is:

1. A storage device comprising:
   a memory core having a first region and a second region both assigned to a given address space, and a third region that stores a fixed value and region information that indicates a position of said second region; and
   a data selecting section,
   (i) said data selecting section being supplied with said region information, a physical address in said address space, said fixed value, and original read data, said original read data being data stored in said memory core at said physical address, (ii) said data selecting section outputting said original read data as read data when said physical address specifies a location other than said second region, and (iii) said data selecting section outputting said fixed value as said read data when said physical address specifies said second region.

2. The storage device according to claim 1, wherein said third region is assigned to said address space.

3. The storage device according to claim 2, wherein said third region is provided in said second region.

4. The storage device according to claim 1, wherein said third region is not assigned to said address space of said memory core.

5. The storage device according to claim 2, wherein said second region includes a plurality of second regions, and said third region stores a table that associates pieces of region information that respectively indicate positions of said second regions and fixed values that are to be outputted from said data selecting section when the respective ones of said second regions are specified.

6. The storage device according to claim 3, wherein said second region includes a plurality of second regions, and said third region stores a table that associates pieces of region information that respectively indicate positions of said second regions and fixed values that are to be outputted from said data selecting section when the respective ones of said second regions are specified.

7. The storage device according to claim 4, wherein said second region includes a plurality of second regions, and said third region stores a table that associates pieces of region information that respectively indicate positions of said second regions and fixed values that are to be outputted from said data selecting section when the respective ones of said second regions are specified.

8. The storage device according to claim 1, further comprising a register that stores said fixed value and said region information, wherein said data selecting section is supplied with said fixed value and said region information from said register.

9. The storage device according to claim 1, further comprising an address conversion table that converts a logical address provided from outside to said physical address, wherein said memory core stores, in said second region:

a redundancy region that stores data in place of a fault area in said first region; and a redundancy conversion region that stores a fault address indicating said fault area, a redundancy address indicating said redundancy region, and said fault address being stored associated with said redundancy address, and wherein when said physical address corresponds to said fault address, said address conversion table adopts said redundancy address as said physical address, and when said redundancy address is adopted as said physical address, said data selecting section outputs said original read data as said read data even though said redundancy address as said physical address specifies said second region.

10. The storage device according to claim 9, further comprising a register that stores said fixed value, said region information, and said redundancy address, wherein said data selecting section is supplied with said fixed value, said region information, and said redundancy address from said register.

11. A data output circuit comprising:

an address comparator that is supplied with region information that indicates a position of a region assigned to an address space of a memory core and a physical address in said address space, said address comparator outputting a control signal indicating whether said physical address specifies the region indicated by said region information; and a selector that is supplied with a fixed value and original read data, said original read data being data stored in said memory core at said physical address, said selector outputting one of said fixed value and said original read data on the basis of said control signal.

12. The data output circuit according to claim 11, further comprising a register that stores said fixed value and said region information.

13. The data output circuit according to claim 11, further comprising an address conversion table that converts a logical address provided from outside to said physical address, wherein when said physical address corresponds to a fault address that indicates a fault area in said memory core, said address conversion table adopts, as said physical address, a redundancy address that indicates a redundancy region that stores data in place of said fault area, and when said redundancy address is adopted as said physical address, said selector outputs said original read data even though said redundancy address as said physical address specifies the region indicated by said region information.

14. The data output circuit according to claim 13, further comprising a register that stores said fixed value, said region information, and said redundancy address, wherein said address comparator is supplied with said region information and said redundancy address from said register, and said selector is supplied with said fixed value from said register.

* * * * *